(12) United States Patent
Nouri

(10) Patent No.: US 6,274,445 B1
(45) Date of Patent: *Aug. 14, 2001

(54) METHOD OF MANUFACTURING SHALLOW SOURCE/DRAIN JUNCTIONS IN A SALICIDE PROCESS

(75) Inventor: Faran Nouri, Los Altos, CA (US)

(73) Assignee: Philips Semi-Conductor, Inc., Tarrytown, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/243,739

(22) Filed: Feb. 3, 1999

(51) Int. Cl.$^7$ .................................................... H01L 21/336
(52) U.S. Cl. .......................... 438/300; 438/564; 438/663; 438/683; 438/692
(58) Field of Search .................................. 438/301, 303, 438/561, 564, 663, 683, 300, 692

(56) References Cited

U.S. PATENT DOCUMENTS

| | | | |
|---|---|---|---|
| 4,688,314 | * 8/1987 | Weinberg | 438/222 |
| 4,707,456 | * 11/1987 | Thomas et al. | 438/207 |
| 5,112,761 | * 5/1992 | Matthews | 438/207 |
| 5,441,914 | * 8/1995 | Taft et al. | 438/626 |
| 5,580,701 | * 12/1996 | Lur et al. | 430/316 |
| 5,668,025 | 9/1997 | Blanchard . | |
| 5,682,055 | 10/1997 | Huang et al. . | |
| 5,683,924 | 11/1997 | Chan et al. . | |
| 5,885,761 | * 3/1999 | Duane et al. | 438/564 |

OTHER PUBLICATIONS

T. Ohguro. et al., High Performance RF Characteristics of Raised Gate/Source/Drain CMOS with Co Salicide, 1998 Symposium on VLSI Technology Digest of Technical Papers, pp. 136–137.

(List continued on next page.)

Primary Examiner—T. N. Quach

(57) ABSTRACT

An ion implanting process allows for shallow source and drain junctions of the transistor. According to one example embodiment, a BARC layer is formed over a gate, and a poly-crystalline or amorphous silicon shield is deposited over the source and drain regions, then the BARC and silicon are chemically mechanically polished. The poly-crystalline or amorphous silicon shield absorbs the initial impact the dopant species of ion implantation and reduces the incidence of irreversible source/drain crystal damage caused by the process. After the ion implantation, the species implanted in the poly or amorphous silicon is diffused into the source/drain regions by annealing. An additional siliciding of the poly or amorphous silicon covering the source and drain minimizes the need for deeper source/drain junctions and hence improves short-channel properties.

34 Claims, 3 Drawing Sheets

OTHER PUBLICATIONS

Y. Kinoshita, et al., An Advanced 0.25 μm BiMOS Process Integration Technology for Multi–GHz Communication LSIs, ULSI Device Development Labs., Silicon System Research Labs, and C&C Media Research Labs, NEC Corporation, IEEE BCTM 4.3, pp. 72–75.

Jiunn–Yann Tsai, et al., DIBL Considerations of Extended Drain Structure for 0.1 μm MOSFET's, Department of Electrical and Computer Engineering, North Carolina State University, Raleigh, NC 27695–7911, Publisher Item Identifier S 0741–3106(96)05317–7, IEEE Electron Device Letters, vol. 17, No. 7, Jul. 1996.

Takahiro Onai, et al., 12–ps ECL Using Low–Base–Resistance Si Bipolar Transistor by Self–Aligned Metal/IDP Technology, Publisher Item Identifier S 0018–9383(97)08301–9, IEEE Transactions on Electron Devices, vol. 44, No. 12, Dec. 1997.

H. Wakabayashi, et al., A High Performance 0.1 μm CMOS with Elevated Salicide using Novel Si–SEG Process, Silicon Systems Research Laboratories, IEDM 97–99—97–102.

* cited by examiner

METHOD OF MANUFACTURING SHALLOW SOURCE/DRAIN JUNCTIONS IN A SALICIDE PROCESS

FIELD OF INVENTION

The present invention is generally directed to the manufacture of a semiconductor device. In particular, the present invention relates to the prevention of ion implantation damage in the source/drain regions of a MOS transistor.

BACKGROUND OF INVENTION

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor (MOS) transistors, such as P-channel MOS (PMOS), N-channel MOS (NMOS) and complementary MOS (CMOS) transistors, bipolar transistors, BiCMOS transistors, etc.

Each of these semiconductor devices generally includes a semiconductor substrate on which a number of active devices are formed. The particular structure of a given active device can vary between device types. For example, in a MOS transistor, an active device generally includes a source and drain region and a gate electrode that modulates current between the source and drain regions.

One important step in the manufacturing of such devices is the formation of devices, or portions thereof, using photolithography and etching processes. In photolithography, a wafer substrate is coated with a light-sensitive material called photo-resist. Next, the wafer is exposed to light; the light striking the wafer is passed through a mask plate. This mask plate defines the desired features printed on the substrate. After exposure, the resist-coated wafer substrate is developed. The desired features as defined on the mask are retained on the photoresist-coated substrate. Unexposed areas of resist are washed away. The wafer, with the desired defined features, is etched. Depending upon the production process, the etching may either be a wet etch in which liquid chemicals are used to remove wafer material or a dry etch in which wafer material is subjected to a radio frequency (RF) induced plasma. A challenge in the etching process is maintaining control over the etching of the features, notably in the source/drain electrode regions of the MOS transistor. A further challenge is to control the electrical characteristics of the source/drain region by establishing a suitable doping profile that provides good conductivity within the constraints of design rules which trend further into the sub-micron range.

Doping the source/drain regions of a MOS transistor is typically accomplished through ion implantation. Unmasked areas of the MOS transistor are subjected to a beam of dopant atoms. Ion implantation has a number of advantages, including the ability to precisely control the number of implanted dopant atoms into substrates, for example, within ±3% in a range of $1 \times 10^{14}$ to $1 \times 10^{18}$ atoms/cm$^3$.

A significant disadvantage to ion implantation is that it causes damage to the material structure of the target. In the single-crystal substrate of the source/drain region crystal defects and even amorphous layers are formed. To restore the target material to its preimplantation condition, thermal processing (e.g., annealing) after implantation must be performed. In some cases, significant implantation damage can not be removed. Damage at the source/drain region can lead to high leakage currents or TED Transient Enhanced Diffusion) of dopants in the sub-micron realm where shallow source/drain regions are necessary.

Also the lateral distribution of implanted species (although smaller than lateral diffusion effects) is not zero. This is a limiting factor in fabricating some minimum sized device structures, such as the electrical channel length between source and drain in self-aligned MOS transistors.

In an effort to address the implant damage, in an example process, regions of epitaxial silicon are selectively grown over the source and drain regions of the MOS transistor after a first source/drain implant to build lightly doped drain (LDD) structures. Depending upon the polarity of the transistor, the source/drain implants will either be P-type for a PMOS transistor or N-type for an N-MOS transistor. These epitaxial regions are implanted with N+ or P+ species. The epitaxial regions are implanted with sufficient energy and dose to achieve continuity with the LDD implant in the substrate. The dopant atoms will diffuse into the silicon in essentially the same shape as the epitaxial regions to form the N+ or P+ source/drain junctions within at least a portion of the regions.

Typically, the more heavily doped source/drain regions have a deeper junction that the LDD regions. LDD regions may typically form to a depth of approximately 1000 angstroms. In NMOS devices, the doses required for this depth would normally be approximately $1-4 \times 10^{13}$ atoms/cm$^2$ of phosphorus or arsenic. With a source/drain diffusion, the second more heavily doped source and drain regions junctions are formed to a depth of approximately 1500 Angstroms below the silicon surface. In NMOS devices, the implant is typically arsenic at a dose of $5 \times 10^{15}$ atoms/cm$^2$. The depth of the source drain regions can be made deeper than the LDD regions.

A significant disadvantage of selective epitaxial growth is that localized epitaxial growth may occur along the sides of the epitaxial region that is the target area of the source/drain region. In addition, there may be some lateral formation of the epitaxial regions over the field oxide or sidewall oxide spacers. Any lateral growth is at least partially the result of the upward growth of the epitaxy over the silicon substrate. Selective epitaxial growth may work on a small scale. However, it is not likely a manufacturable process that could be integrated into a modern CMOS production line.

Sub-micron technologies require the formation of ultra shallow junctions for the source/drain extensions in order to minimize the short channel effects. The contact region however, will have to be deeper than the source/drain extensions to allow for the use of salicide technology. Salicide (Self-Aligned Silicide) technology involves depositing a metal over exposed silicon in a MOS structure. The deposited metal is reacted with the Si to form a silicide, usually in the source/drain regions as well as exposed poly-Si areas of the gate. Salicide technology is necessary to lower the extrinsic series resistance, reduce contact resistance, and minimize gate RC delays. To reduce Rs, silicide must be of a certain thickness, the thinner the silicide, the higher the resistance. Thicker silicide however, requires deeper source/drain junctions to reduce junction leakage. The deeper source/drain junctions can in turn lead to a degradation of short-channel effects (such as drain induced barrier lowering—DIBL) because of the additional charge sharing by the deep source/drain. These requirements represent conflicting demands for sub-micron (0.18 μm) technologies. Efforts to circumvent this limitation to the scaling of source/drain junctions are problematic.

Accordingly, there is a need for a semiconductor device having a source/drain structure that addresses these above-mentioned issues, is substantially free of defects, has predictable dimensions, and does not add extra manufacturing costs as the process technology is approaching fractional microns in feature sizes.

SUMMARY OF INVENTION

In a method for reducing the likelihood of implant damage during the manufacturing of a source/drain structure for a MOS transistor structure, one embodiment includes depositing of a silicon layer over the source region and drain region. Next, the MOS structure undergoes a planarizing process to smooth out the deposited silicon layer. The silicon layer is implanted with a species of the same polarity type as that of the source/drain structure. The implanted species are diffused from the silicon layer into the source/drain regions to form the completed source/drain regions of the MOS transistor structure.

In another embodiment of the present invention, the manufacturing of a source/drain structure includes depositing a silicon layer over the source region and drain region, and planarizing the silicon layer. Next, the silicon layer is implanted with species of the same polarity as that of the source/drain regions. By annealing, for example, the implanted species in the silicon layer is diffused into the source/drain regions. Next, a refractory metal is deposited on top of the silicon layer. Reacting the refractory metal with the silicon layer forms a silicide of the silicon layer.

The above summary of the present invention is not intended to represent each disclosed embodiment, or every aspect, of the present invention. Other aspects and example embodiments are provided in the figures and the detailed description that follows

BRIEF DESCRIPTION OF THE DRAWINGS

The invention may be more completely understood in consideration of the following detailed description of various embodiments of the invention in connection with the accompanying drawings, in which:

FIG. 1A illustrates in cross-section a transistor structure with a first poly-silicon layer before definition of the gates;

FIG. 1B illustrates the transistor of FIG. 1A at the gate masking step;

FIG. 1C illustrates the transistor of FIG. 1B after the patterning of the gate in the first poly-silicon layer;

FIG. 1D illustrates the transistor of FIG. 1C after the source and drain regions of the CMOS transistor structure;

FIG. 1E illustrates the transistor of FIG. 1D after forming dielectric spacers;

FIG. 1F illustrates the transistor of FIG. 1E after deposition of a second poly-silicon layer;

FIG. 1G illustrates the transistor of FIG. 1F after planarization of the second poly-silicon layer;

FIG. 1H illustrates the implanting of species in the transistor structure of FIG. 1G;

FIG. 1I illustrates the siliciding of the first and second poly-silicon layers of the transistor structure of FIG. 1H.

Figure 1A:
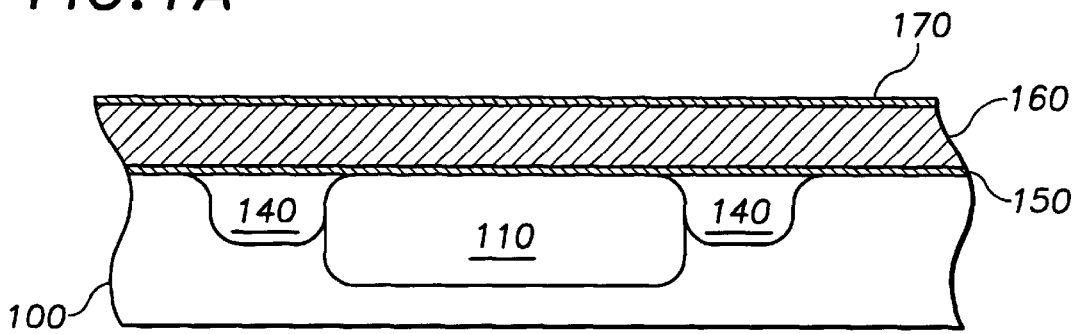
FIGS. 1A–1I illustrate an example set of steps used in connection with an example implementation of the present invention.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

According to an example embodiment of the present invention, a double poly CMOS structure has the S/D regions doped through the second poly-silicon layer. Doping the S/D regions through the poly allows the formation of shallow junctions with no implant damage. The removal of the implant damage can minimize the TED transient Enhanced Diffusion) due to the implant damage. Minimizing implant damage is a significant challenge of deep sub-micron processing. In addition, this technology eases the salicide requirements by suppressing junction leakage.

In FIGS. 1A–1I, a series of cross-sectional views illustrates an example device manufacturing process according to the present invention. The process first deposits a layer of poly silicon (poly-Si) over an underlying structure. In another example embodiment, amorphous silicon (α-Si) may be used in place of poly-Si. To build the underlying structure, the steps preceding the deposition of the α-Si and poly-Si may be accomplished with a modern sub-micron CMOS process.

In FIG. 1A, an NMOS device structure 100 is shown with a P-well 110. STI (shallow trench isolation) oxide regions 140 isolate the device structure 100 from others. A thin oxide layer 150 (with an approximate thickness in the range of 25 Å to 100 Å), covers the P-well region 110. About 1000 Å to 3000 Å of an undoped poly-Si layer 160 is deposited upon the thin oxide layer 150. This and the succeeding process steps are also applicable to a PMOS device structure, for example, in a CMOS-based technology.

The bottom anti-reflective coating (BARC) layer 170 is formed over the poly-Si layer 160 to reduce the reflection of light during a subsequent photo-lithographic patterning process. Metals, such as aluminum, tungsten, and copper, typically have a relatively high reflectivity. Therefore, it is often necessary to provide a BARC layer with reduced reflectivity to reduce the broadening or narrowing of features. For example, in the absence of the BARC layer 170, "reflective notching" occurs when the topography of the underlying surface (e.g., a slope in the topography) causes the reflection of light at angles not perpendicular to the surface of the photo-resist. The ARC layer may enhance adhesion of subsequently deposited dielectric layers. In an example process, the BARC layer thickness ranges from approximately 200 Å to 300 Å.

Materials suitable for the BARC layer 170 typically have low reflectivity of light for the wavelength range used to form the pattern. Therefore, the particular materials useful for forming the ARC layer 170 depend on the size of the features and the design rules. For 0.25 μm design rules, titanium nitride is a useful material for the BARC layer 170. Other suitable materials for the BARC layer 170 include, for example, silicon oxynitride, silicon nitride, silicon dioxide, and organic ARC materials. Although the ARC material may be non-conductive, it is often desirable to use a conductive ARC. Otherwise, with additional process steps, the non-conductive ARC material needs to be removed, at least in via locations, to allow connection between the gate stack structure 160 (FIG. 1C) and subsequently formed interconnects or contacts.

Figure 1B:
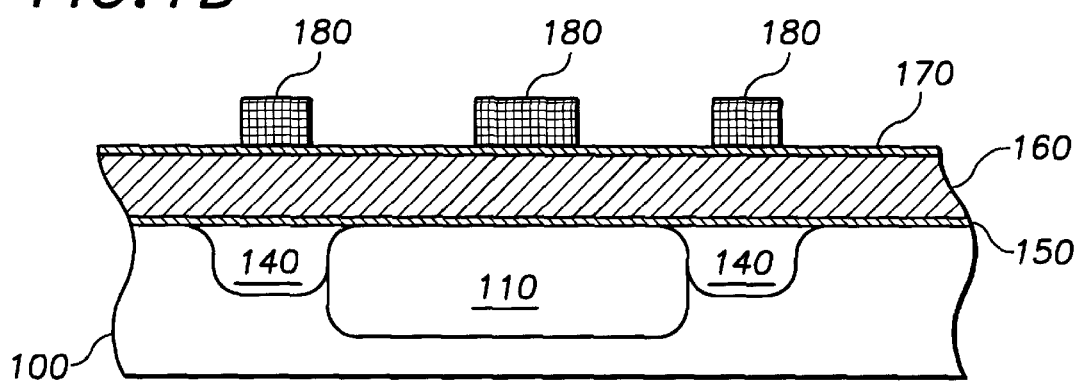
Figure 1C:
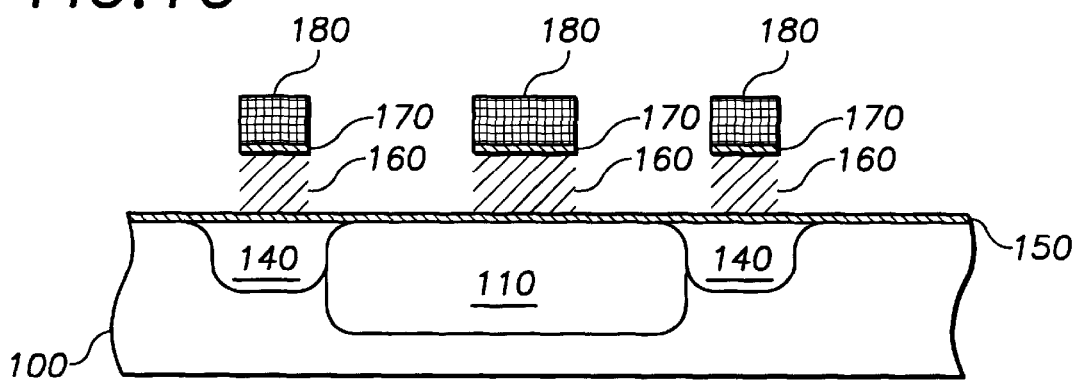

Referring to FIGS. 1B and 1C, the poly-Si mask layer 180 is defined on the BARC layer 170. The poly-Si (or α-Si) is patterned with standard photo-lithographic techniques to define the gate regions of the NMOS device structure 100. The unmasked areas of undoped α-Si are removed with a plasma etch process. Photo resist is plasma ashed and the device structure is cleaned. The α-Si layer 160 is then annealed. An additional 100 Å oxide is formed with a re-oxidation step at about 850° C. FIG. 1C shows the resulting structure.

Figure 1D:
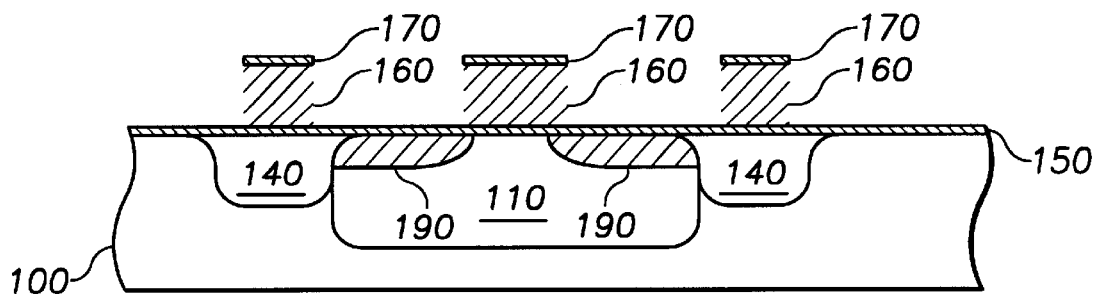

In FIG. 1D, N+ regions 190 are implanted in the P-well 110 to define the source and drain regions of the NMOS transistor. These are often referred to as source-drain extensions or lightly doped drains (LDD). Similarly, in a PMOS transistor structure (not illustrated), the process defines corresponding P+ regions. In an example sub-micron process, the N+ regions 190 are defined in the P-well 110 during a NLDD implant process of arsenic combined with an N-pocket implant of Boron-11. The corresponding P+ regions of a PMOS transistor (not illustrated) are defined in an N-well during a PLDD implant process of $BF_2$ combined with the P-pocket implant of phosphorus.

In processes not illustrated, the poly-Si or α-Si gate region is made N-type or P-type depending upon whether the transistor is NMOS or PMOS.

In an example 0.25 μm process, for N-type poly-Si, phosphorus is implanted at a dose of $3 \times 10^{15}$ atoms/cm$^2$ at an energy of 50 KeV. For P-type poly-Si, boron is implanted at a dose of $1 \times 10^{15}$ atoms/cm$^2$ at an energy of 20 Kev. As the critical dimensions shrink, heavier doping is often necessary. For an example 0.20 μm process, the N-type dose remains the same. However, the P-type dose of boron is increased to $2 \times 10^{15}$ atoms/cm$^2$ with the same 20 KeV energy of the example 0.25 μm process.

Referring to FIG. 1D, in an example process, a spacer (or dielectric) material is eposited over the gate regions to protect them from subsequent processing. The thickness of the spacer material ranges from approximately 1000 Å–1500 Å. Spacer material is typically formed as a conformal layer over the underlying structures and may be formed by a variety of techniques including among others, chemical vapor deposition (CVD), physical vapor deposition, or spin-on techniques. In particular, CVD is a commonly used method for forming a conformal layer over a surface having structure. The spacer material may use a variety of materials. Oxides and nitrides, such as silicon dioxide, silicon nitride, and silicon oxynitride, are used often as spacer materials. Photo resist may also be a convenient spacer material as it can be easily formed on the structures by a CVD process and easily removed by techniques, such as ashing. Ashing involves using an oxygen ($O_2$) plasma to "burn" off the organic photoresist compounds.

Figure 1E:
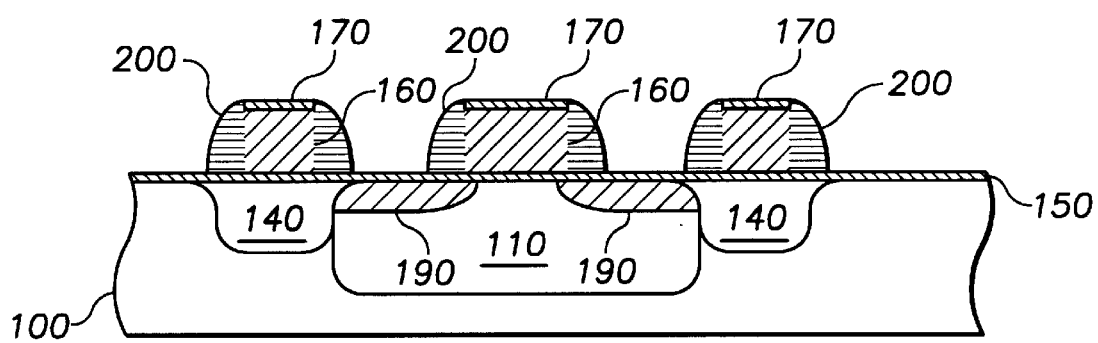

In an example spacer formation process, the device structure of FIG. 1D undergoes a Thermally Enhanced Oxidation of Silicon (TEOS) process. An example process deposits approximately 1600 Å of TEOS. Next, in a densification process at 1000° C., the deposited TEOS undergoes a Rapid Thermal Annealing (RTA) for approximately 60 seconds. After the annealing, the oxide is etched in a mixture of $CF_4$ and $CHF_3$. In one particular example process, the recipe includes a mixture of three gases in the range of approximately, $CF_4$ at 9 sccm, $CHF_3$ at 36 sccm, a carrier gas Ar at 100 sccm. These gases may be set at a pressure of approximately 20 mT. The plasma reactor's power settings are adjusted to approximately 500 Watts on the wafer's top surface and 800 Watts underneath the wafer's bottom surface. Etching proceeds until an end-of-etch endpoint is detected. FIG. 1E illustrates the structure with the TEOS spacers 200.

Figure 1F:
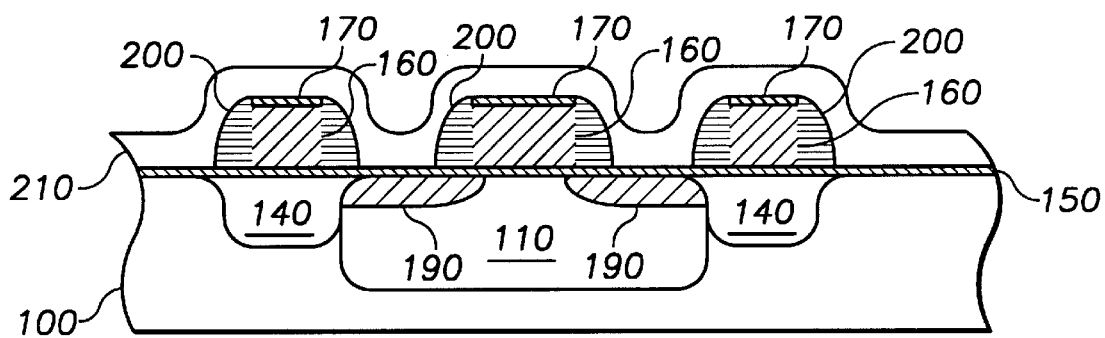
Figure 1G:
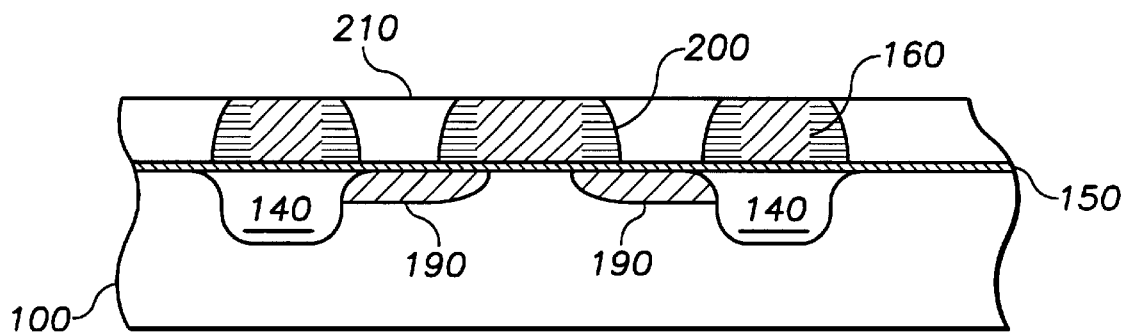

Referring to FIG. 1F, a second poly-silicon layer 210 is deposited on the transistor structure 100. The second poly-Si layer conforms to the underlying topology. The second poly-silicon layer 210 may include, for example, a compound such as phosphorus, arsenic, antimony, and bismuth. Thickness ranges from approximately 1000 Å–2000 Å (e.g. 1500 Å). Through CMP, the structure is planarized until the first poly-Si layer 160 is exposed. The spacers 160 defined previously isolate the first poly-Si layer 160 from the second poly-Si layer 210. FIG. 1G shows the resulting structure. Throughout the example process, amorphous silicon may be used in place of poly-silicon.

Figure 1H:
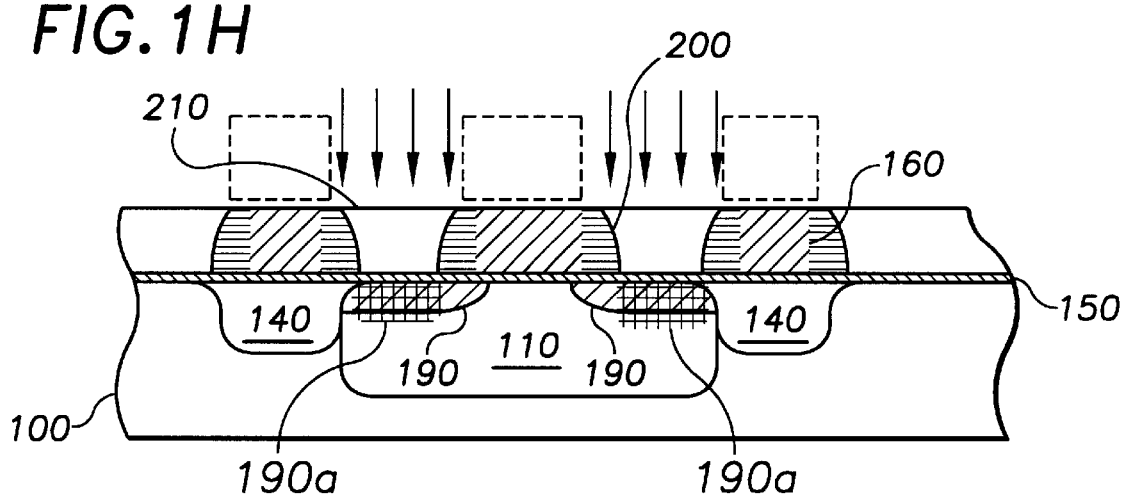

Through ion implantation, a dopant is implanted into the second poly-Si layer 210 in he areas covering the source/drain regions 190. A Rapid Thermal Annealing (RTA) process is used to diffuse the dopant out of the second poly-Si and into the single crystal silicon below at the source/drain regions 190. FIG. 1H shows the resulting source/drain regions 190 and 190a.

Figure 1I:
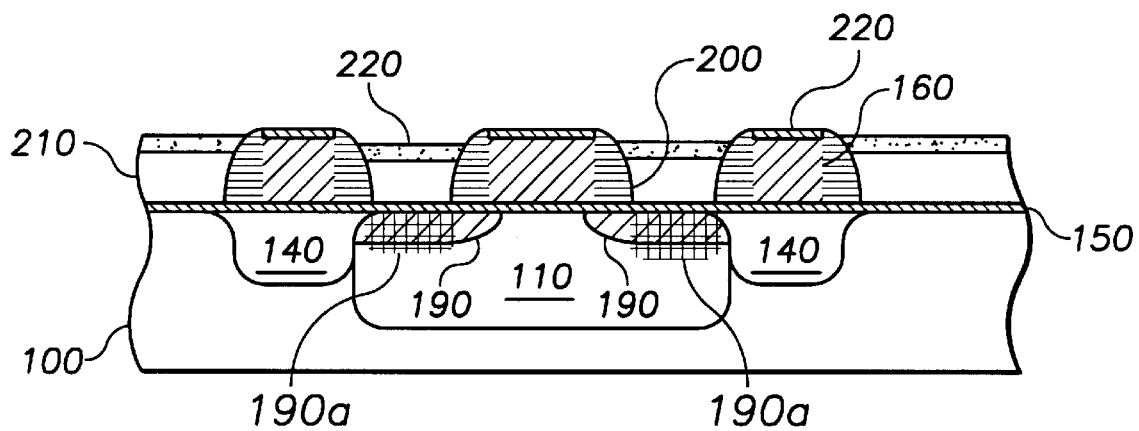

As shown in FIG. 1I, after the RTA process, titanium is deposited on the transistor structure 100 and reacted to form $TiSi_2$ 220 over the first poly-Si layer 160 and the second poly-Si layer 210. The spacers 200 isolate the first poly-Si layer 160 and the second polysilicon layer 210 from one another. Metals other than titanium may be used to form silicides in the poly-Si layers. Among others, these include molybdenum, tantalum, tungsten, platinum, palladium, nickel, and cobalt.

Since the second poly-Si has absorbed the impact of the implanted species, there is no implant damage to the single-crystal source/drain regions 190 and 190a. The undesirable transient enhanced diffusion (TED) of impurities, that may occur if the source/drain regions were implanted by the conventional methods, are minimized. The siliciding of the two poly-Si layers lessens the need for deeper source/drain junctions and improves the short channel effects of a CMOS process.

While the present invention has been described with reference to several particular example embodiments, those skilled in the art will recognize that many changes may be made thereto without departing from the spirit and scope of the present invention, which is set forth in the following claims.

What is claimed:

1. A method of manufacturing a MOS device structure having a substrate area of a first polarity type, a source regions a drain region, and a gate over a thin oxide, the method comprising:

forming a BARC layer over the gate;
depositing a silicon layer over the source region and drain region;
using a CMP process and planarizing the silicon layer and the BARC layer and exposing the gate;
implanting the silicon layer with species of a second polarity type; and
diffusing the species from the silicon layer into the source region and the drain region.

2. The method as recited in claim 1 wherein depositing the silicon layer comprises depositing at least one of the following: poly-crystalline silicon and amorphous silicon.

3. The method as recited in claim 1 wherein the first polarity type is of opposite polarity from the second polarity.

4. The method as recited in claim 3 wherein the first polarity type is negative and the second polarity type is positive.

5. The method as recited in claim 4 wherein the first polarity type is biased using compounds that include a species having at least one of: Phosphorus, Arsenic, Antimony, and Bismuth.

6. The method as recited in claim 4 wherein the second polarity type is biased using compounds that include species of Boron.

7. The method as recited in claim 1 wherein the diffusing of the species from the silicon layer into the source region and the drain region comprises annealing the MOS device structure.

8. The method as recited in claim 7 wherein depositing the second polarity type comprises depositing compounds that include a species having at least one of: Phosphorus, Arsenic, Antimony, and Bismuth.

9. The method as recited in claim 7 wherein the first polarity type is biased using compounds that include species of Boron.

10. The method of claim 1, wherein forming a BARC layer over the gate includes forming a BARC layer including a material selected from the group of: silicon oxynitride, silicon nitride, silicon dioxide, and organic ARC materials.

11. A method of manufacturing a MOS device structure having a substrate area of a first polarity type, a source region, a drain region, and a silicon gate over a thin oxide, comprising:
forming a BARC layer over the gate;
depositing a silicon layer over the source region and drain region;
planarizing the silicon layer and the BARC layer and exposing the gate;
implanting the silicon layer with species of a second polarity type;
annealing the MOS device structure and diffusing the species from the silicon layer into the source region and the drain region;
depositing a refractory metal on the silicon gate and on the silicon layer; and
Reacting the refractory metal and forming a silicide in the silicon gate and in the silicon layer.

12. The method as recited in claim 11 wherein the silicon layer comprises at least one of the following: poly-crystalline silicon and amorphous silicon.

13. The method as recited in claim 11 wherein the first polarity type is of opposite polarity from the second polarity.

14. The method as recited in claim 13 wherein the first polarity type is positive and the second polarity type is negative.

15. The method as recited in claim 14 wherein the second polarity type is biased using compounds that include a species having at least one of: Phosphorus, Arsenic, Antimony, and Bismuth.

16. The method as recited in claim 14 wherein the first polarity type is biased using compounds that include species of Boron.

17. The method as recited in claim 13 wherein the first polarity type is negative and the second polarity type is positive.

18. The method as recited in claim 17 wherein the first polarity type is biased using compounds that include a species having at least one of: Phosphorus, Arsenic, Antimony, and Bismuth.

19. The method as recited in claim 17 wherein the second polarity type is biased using compounds that include species of Boron.

20. The method as recited in claim 11 wherein the planarizing the silicon layer is by a CMP process.

21. The method as recited in claim 11 wherein the refractory metal comprises at least one of the following: Titanium, Molybdenum, Tantalum, Tungsten, Platinum, Palladium, Nickel, and Cobalt.

22. A method for creating a shallow source and shallow drain region in a transistor structure comprising:
forming an oxide layer on a substrate of a first polarity;
depositing a first silicon layer on the oxide;
defining a silicon gate on the first silicon layer;
defining the source region and the drain region in the substrate, the source region and the drain region coupled to the silicon gate through the oxide;
depositing a spacer dielectric over the silicon gate;
etching the spacer dielectric and defining a dielectric spacer conforming to the silicon gate;
forming a BARC layer over the gate;
depositing a second silicon layer and substantially conforming the second silicon layer to the silicon gate, source, drain, and dielectric spacer;
planarizing the second silicon layer and the BARC layer until the BARC layer is removed and the second silicon layer is substantially flush with the spacer dielectric;
implanting the second silicon layer over the source region with a species of the second polarity type and further biasing the source region to a second polarity and implanting the second silicon layer over the drain region with a species of the second polarity type and further biasing the drain region to a second polarity;
annealing the transistor structure;
depositing a refractory metal on the first silicon layer and the second silicon;
reacting the refractory metal and forming a silicide in the first silicon layer and in the second silicon layer.

23. The method as recited in claim 22 wherein the first silicon layer and the second silicon layer include at least one of the following: poly-crystalline and amorphous silicon.

24. The method as recited in claim 22 wherein the first silicon layer and the second silicon layer are undoped.

25. The method as recited in claim 22 wherein the first silicon layer and the second silicon layer are an opposite polarity of the first polarity.

26. The method as recited in claim 22 wherein the dielectric spacer comprises dielectrics selected from the group of silicon nitrides and silicon oxides.

27. The method as recited in claim 22 wherein the planarizing of the second silicon layer is done with an etch-back process.

28. The method as recited in claim 22 wherein the planarizing of the second silicon layer is done with a CMP process.

29. The method as recited in claim 22 wherein the first polarity is opposite the second polarity.

30. The method as recited in claim 22 wherein the first polarity is positive and the second polarity is negative.

31. The method as recited in claim 22 wherein the first polarity is negative and the second polarity is positive.

32. The method as recited in claim 31 wherein the first polarity is obtained using compounds that include a species having at least one of: Phosphorus, Arsenic, Antimony, and Bismuth and the second polarity is obtained using compounds of Boron.

33. The method as recited in claim 31 wherein the second polarity is obtained using compounds that include a species having at least one of: Phosphorus, Arsenic, Antimony, and Bismuth and the first polarity is obtained using compounds of Boron.

34. The method as recited in claim 22 wherein the refractory metal comprises at least one of the following: Titanium, Molybdenum, Tantalum, Tungsten, Platinum, Palladium, Nickel, and Cobalt.

* * * * *